US011513149B2

United States Patent
Kakushima et al.

(10) Patent No.: US 11,513,149 B2
(45) Date of Patent: Nov. 29, 2022

(54) METHOD FOR EVALUATING ELECTRICAL DEFECT DENSITY OF SEMICONDUCTOR LAYER, AND SEMICONDUCTOR ELEMENT

(71) Applicant: SUMITOMO CHEMICAL COMPANY, LIMITED, Tokyo (JP)

(72) Inventors: Kuniyuki Kakushima, Yokohama (JP); Takuya Hoshii, Yokohama (JP); Hitoshi Wakabayashi, Yokohama (JP); Kazuo Tsutsui, Yokohama (JP); Hiroshi Iwai, Yokohama (JP); Taiki Yamamoto, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 217 days.

(21) Appl. No.: 16/639,040

(22) PCT Filed: Aug. 6, 2018

(86) PCT No.: PCT/JP2018/029484
§ 371 (c)(1),
(2) Date: Feb. 13, 2020

(87) PCT Pub. No.: WO2019/039257
PCT Pub. Date: Feb. 28, 2019

(65) Prior Publication Data
US 2020/0225276 A1 Jul. 16, 2020

(30) Foreign Application Priority Data
Aug. 24, 2017 (JP) .............................. JP2017-161604

(51) Int. Cl.
G01R 31/26 (2020.01)
H01L 29/207 (2006.01)

(52) U.S. Cl.
CPC ........ *G01R 31/2601* (2013.01); *H01L 29/207* (2013.01)

(58) Field of Classification Search
CPC . G01R 31/2601; H01L 22/14; H01L 29/2003; H01L 29/207; H01L 29/7786; H01L 29/80; H01L 21/66
(Continued)

(56) References Cited

U.S. PATENT DOCUMENTS 6,177,292 B1 1/2001 Hong et al.
6,295,630 B1 9/2001 Tamegaya

FOREIGN PATENT DOCUMENTS

JP H11-001399 A 1/1999
JP H11-126911 A 5/1999
(Continued)

OTHER PUBLICATIONS

Jain et al: "JV characteristics of GaN containing traps at several discrete energy levels", Solid State Electronics, Elsevier Science Publishers, Barking, GB, vol. 54, No. 3, Mar. 2010, pp. 288-293.
(Continued)

Primary Examiner — Jermele M Hollington
Assistant Examiner — Courtney G McDonnough
(74) Attorney, Agent, or Firm — Foley & Lardner LLP

(57) ABSTRACT

One embodiment of the present invention provides a method for evaluating the electrical defect density of a semiconductor layer, which comprises: a step for measuring an electric current by applying a voltage to a semiconductor element 1 which comprises a GaN layer 12 that serves as a semiconductor layer; and a step for deriving the electrical defect density in the GaN layer 12 with use of the measured electric current value.

3 Claims, 11 Drawing Sheets

(58) Field of Classification Search
USPC .................................................. 324/762.01
See application file for complete search history.

(56) References Cited

FOREIGN PATENT DOCUMENTS

JP          H11-154696 A     6/1999
JP          2000-049339 A    2/2000

OTHER PUBLICATIONS

Keith Gibbs: "The charge and discharge of a capacitor"; webpage: https://www.schoolphysics.co.uk/age16-19/Electricity%20and%20magnetism/Electrostatics/text/Capacitor_charge_and_discharge/index.html; accessed on Mar. 18, 2021; 2016; pp. 1-2.

Mares Jiri et al: "Radial space-charge-limited electron flow in semi-insulating GaN:Fe", Journal of Applied Physics, American Institute of Physics, US, vol. 110, No. 1, Jul. 14, 2011, pp. 13723-13723-6.

Partial Supplementary European Search Report dated Mar. 30, 2021 for corresponding European Patent Application No. 18847691.5.

International Searching Authority, "International Search Report," issued in connection with International Patent Application No. PCT/JP2018/029484, dated Sep. 25, 2018.

International Searching Authority, "Written Opinion," issued in connection with International Patent Application No. PCT/JP2018/029484, dated Sep. 25, 2018.

Kataoka et al., "A proposal of defect density extraction method for GaN epi-wafers", The 78th JSAP Autumn Meeting, vol. 78, Aug. 25, 2017, p. 12-211.

Ambacher et al., "Two-dimensional electron gases induced by spontaneous and piezoelectric polarization charges in N- and Ga-face AlGaN/GaN heterostructures," Journal of Applied Physics, vol. 85, No. 8, Mar. 15, 1999, pp. 3222-3233.

Canali, et al., "Transient and steady 4,5 state space-charge-limited current in CdTe", Solid State Electronics, 18(10): 871-872 (1975).

European Extended Search Report, dated Jun. 11, 2021, issued in corresponding European Patent Application No. 18847691.5, (19 pages).

Hinoki, et al., "Effects of traps 1,4-6 formed by threading dislocations on off-state breakdown characteristics in GaN buffer layer in AlGaN/GaN heterostructure field-effect transistors", Applied Physics Express, Japan Society of Applied Physics, 1(1): 011103-1-011103-3 (2008).

Office Action dated Oct. 5, 2021 issued in a corresponding Japanese Patent Application No. 2017-161604, (7 pages).

Canali, et al., "Transient and steady state space-charge-limited current in CdTe", Solid-State Electronics, vol. No. 18, pp. 871-874, (1975).

Office Action dated Nov. 25, 2021 issued in a corresponding Taiwanese Patent Application No. 107128599, (11 pages).

Notification of Reasons for Refusal issued in corresponding Japanese Patent Application No. 2017-161604 dated May 10, 2022.

Office Action issued in corresponding Taiwanese Patent Application No. 107128599 dated Apr. 25, 2022.

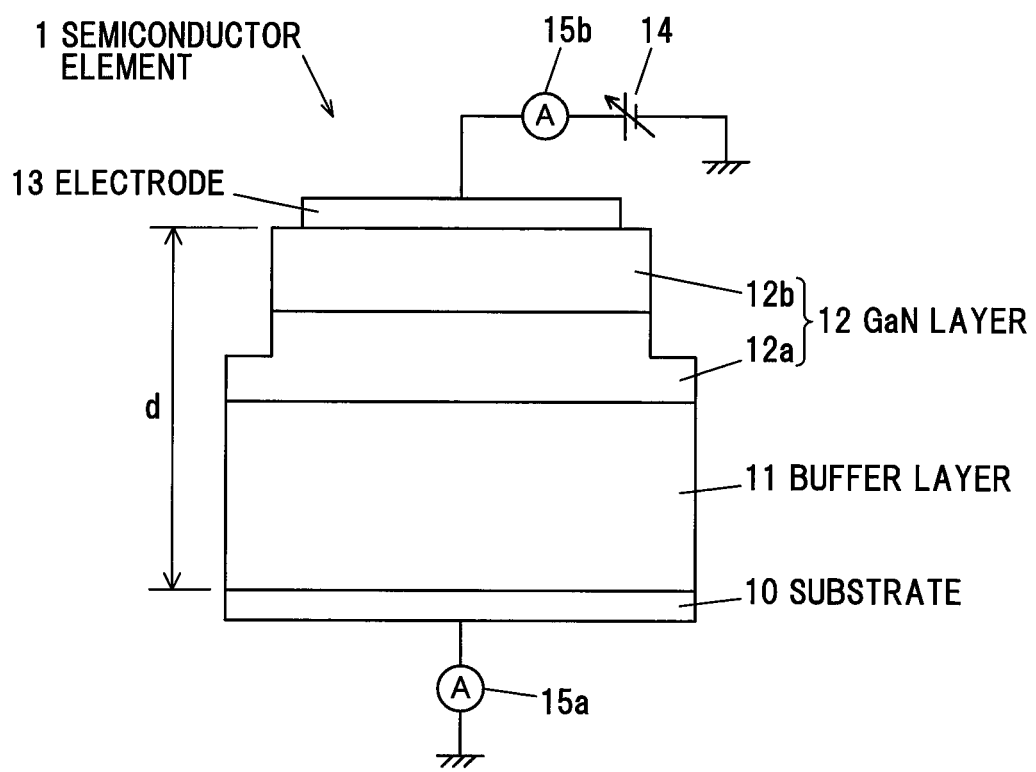

METHOD FOR EVALUATING ELECTRICAL DEFECT DENSITY OF SEMICONDUCTOR LAYER, AND SEMICONDUCTOR ELEMENT

CROSS-REFERENCE TO RELATED APPLICATIONS

The present application claims priority under 37 U.S.C. § 371 to International Patent Application No. PCT/JP2018/029484, filed Aug. 6, 2018, which claims priority to and the benefit of Japanese Patent Application No. 2017-161604, filed on Aug. 24, 2017. The contents of these applications are hereby incorporated by reference in their entireties.

TECHNICAL FIELD

The present invention relates to a method for evaluating the electrical defect density of a semiconductor layer and a semiconductor element.

BACKGROUND ART

In a semiconductor element such as a transistor, if electrons or holes are trapped in a defect level (trap level) formed by impurities, defects, or the like in a semiconductor layer, generation of a leakage current or variation of a threshold voltage will be caused. Therefore, in order to manufacture a highly reliable semiconductor element, it is important to know the density of electrical defects (defects due to atomic defect or residual impurity) in the semiconductor layer. The density of the electrical defects is approximately equal to the sum of the carrier density and the density of the charge trapped in the defect level.

Conventionally, there has been known a method for deriving a carrier density profile in a semiconductor layer from a CV curve (a curve showing the relationship between a capacitor capacitance and a gate voltage) profile (see, e.g., Non-Patent Literature 1).

CITATION LIST

Patent Literature

Non-Patent Literature 1: O. Ambacher, et al., "Two-dimensional electron gases induced by spontaneous and piezoelectric polarization charges in N- and Ga-face AlGaN/GaN heterostructures," Journal of Applied Physics 85, 3222, 1999.

SUMMARY OF INVENTION

Technical Problem

However, with the method for deriving the carrier density from the CV curve profile, it is difficult to monitor the density of electrons and holes trapped in a deep trap level. For this reason, it is difficult to evaluate the electrical defect density of a wide bandgap semiconductor having a deep trap level.

It is an object of the present invention to provide a method for evaluating the electrical defect density of a semiconductor layer applicable to a wide bandgap semiconductor having a deep defect level and a semiconductor element having a low electrical defect density which can be evaluated by the method.

One embodiment of the present invention provides a method for evaluating electrical defect density of a semiconductor layer of the following [1] to [3] and a semiconductor element of the following [4] to [6].

[1] A method for evaluating an electrical defect density of a semiconductor layer, comprising:
  a step for measuring an electric current by applying a voltage to a semiconductor layer; and
  a step for deriving the electrical defect density in the semiconductor layer with use of a measured electric current value.

[2] The method for evaluating an electrical defect density of a semiconductor layer according to [1] as above, wherein the electrical defect density in the semiconductor layer is derived using a value of a current on a low potential side of the semiconductor layer.

[3] The method for evaluating an electrical defect density of a semiconductor layer according to [1] as above, wherein the electrical defect density in the semiconductor layer is derived by using a difference between a value of a current on a low potential side of the semiconductor layer and a value of a current on a high potential side of the semiconductor layer.

[4] A semiconductor element, comprising:
  a semiconductor layer serving as a current path, wherein
    a maximum value of an electrical defect density obtained by using a charge amount immediately after current application and a charge amount in steady state of the semiconductor layer is $1.0 \times 10^{19}$ cm$^{-3}$ or less.

[5] The semiconductor element, according to [4] as above, wherein a planar density of electrical defects in the semiconductor layer obtained by using a net charge amount accumulated in the semiconductor layer by the current application increases with two gradients, in a region where the planar density of the electrical defects increases as a distance from a low potential side surface at the time of the current application to the semiconductor layer.

[6] The semiconductor element according to [4] or [5] as above, wherein a bandgap of the semiconductor layer is 2.5 eV or more.

Advantageous Effects of Invention

According to the present invention, it is possible to provide a method for evaluating the electrical defect density of a semiconductor layer, which can be applied to a wide bandgap semiconductor having a deep defect level, and a semiconductor element having a low electrical defect density which can be evaluated by the method.

BRIEF DESCRIPTION OF DRAWINGS

FIG. 1 is a vertical sectional view of an example of a semiconductor element suitable for evaluation by the method for evaluating electrical defect density of a semiconductor layer according to this embodiment.

DESCRIPTION OF EMBODIMENT (Semiconductor Element 1)

Figure 2A:
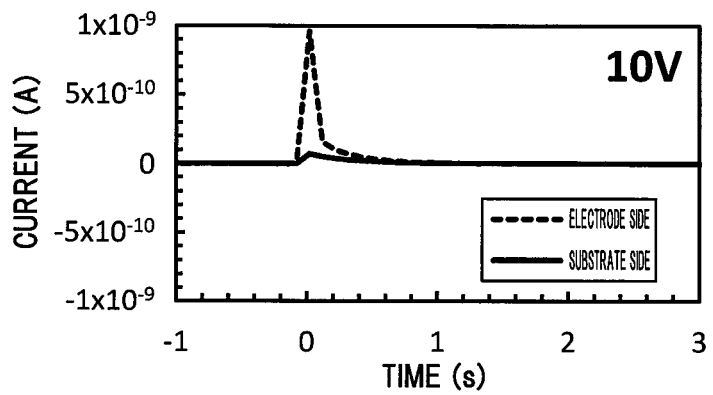
FIG. 2A is a graph showing temporal changes in substrate current and electrode current when the applied voltage is 10V.
Figure 2B:
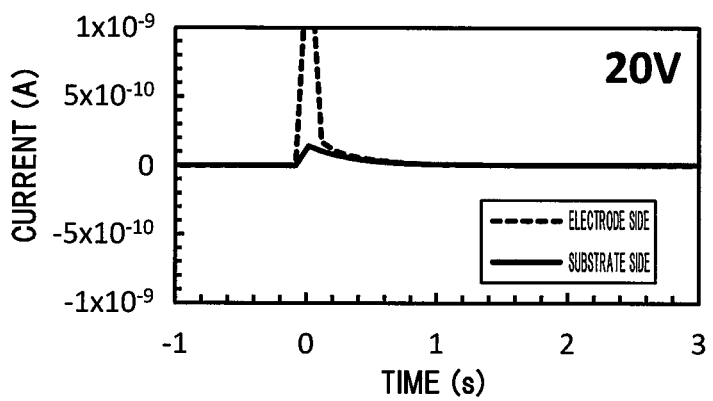
FIG. 2B is a graph showing temporal changes in substrate current and electrode current when the applied voltage is 20V.
Figure 2C:
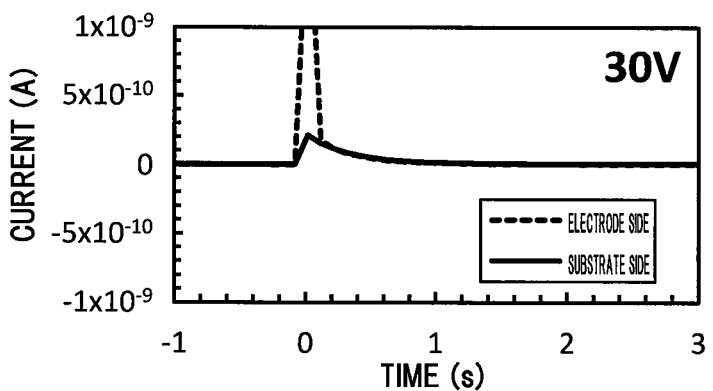
FIG. 2C is a graph showing temporal changes in substrate current and electrode current when the applied voltage is 30V.
Figure 2D:
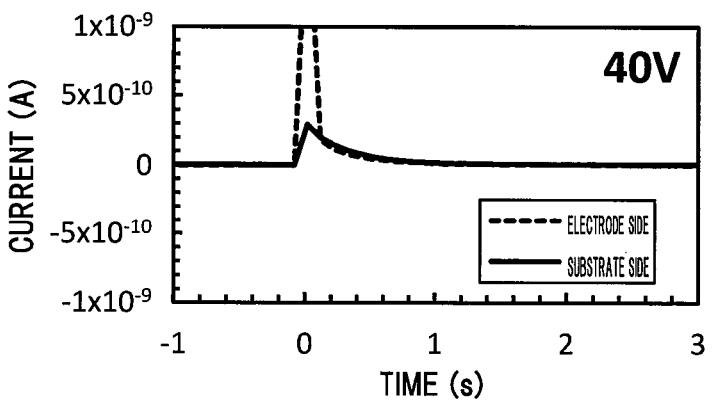
FIG. 2D is a graph showing temporal changes in substrate current and electrode current when the applied voltage is 40V.

FIG. 1 is a vertical cross-sectional view of a semiconductor element 1 which is an example of a semiconductor element suitable for evaluation by the method for evaluating electrical defect density of a semiconductor layer according to this embodiment.

The semiconductor element 1 includes a substrate 10 made of a semiconductor such as Si, a nitride semiconductor layer 12 made of GaN or the like formed on the substrate 10 via a buffer layer 11, and an electrode 13 having a laminated structure made of a plurality of metals such as Ti/Al/Ni/Au. The nitride semiconductor layer 12 includes, e.g., an impurity-doped nitride semiconductor layer 12a made of a GaN film doped with impurities such as C (carbon) and an undoped nitride semiconductor layer 12b made of a GaN film or the like which is undoped with impurities, on the impurity-doped nitride semiconductor layer 12a.

Although the materials and thicknesses of the buffer layer 11, the impurity-doped nitride semiconductor layer 12a, and the undoped nitride semiconductor layer 12b can be arbitrarily determined, in a method for evaluating an electrical defect density of a semiconductor described later, as an example, the nitride semiconductor layer 12, the impurity-doped nitride semiconductor layer 12a, and the undoped nitride semiconductor layer 12b are a GaN layer 12, the C—GaN layer 12a, and an undoped GaN layer 12b, respectively. The thicknesses of the buffer layer 11, the C—GaN layer 12a, and the undoped GaN layer 12b were 3.5 μm, 730 nm, and 570 nm, respectively. Also, the electrode 13 may have an arbitrary shape, but similarly, as an example, a circular electrode having a radius of 560 μm and an area of 1 mm$^2$ was used.

(Method for Evaluating Electrical Defect Density of Semiconductor)

A voltage can be applied between the substrate 10 and the electrode 13 by a variable DC power source 14. The current (substrate current) flowing through the substrate 10 can be measured by the ammeter 15a and the current (electrode current) flowing through the electrode 13 can be measured by the ammeter 15b.

FIGS. 2A to 2D, 3A to 3D, 4A to 4D, 5A to 5D, and 6A to 6D are graphs showing temporal changes in substrate current and electrode current when the applied voltage is 10 to 200V. The value of the substrate current is multiplied by −1.

When the applied voltage is 90V or more, the electrode current flows backward, but this is presumably because the electrons emitted from the trap level of the nitride semiconductor layer 12 are excessive to the electrons emitted from the trap level of the buffer layer 11, so that a well is formed in the nitride semiconductor layer 12 and the potential of the nitride semiconductor layer 12 is increased so that electrons are supplied from the electrode 13.

In the present embodiment, the density of electrical defects in the nitride semiconductor layer 12 made of, e.g., a GaN layer which is a part of the semiconductor layer is obtained. According to the present embodiment, since the density of electric charge emitted from a deep defect level can be obtained, it is also possible to obtain the electrical defect density of a wide bandgap semiconductor having a deep defect level. Hereinafter, two types of electrical defect density evaluation methods will be described using this semiconductor element 1. In the following description, charge and electric capacity of each part are defined per unit area.

(First Method)

The first method is a method of obtaining the density of the electrical defect of the semiconductor layer from the substrate current measured by the ammeter 15a.

When the semiconductor element 1 is regarded as a capacitor, the capacitance $C_{cap}$ of the semiconductor element 1, which is an ideal capacitor in which all regions of the buffer layer 11 and the GaN layer 12 are depleted, is expressed by the following equation 1.

[Equation 1]

$$\frac{1}{C_{cap}} = \frac{d_G}{\varepsilon_G \varepsilon_0} + \frac{d_b}{\varepsilon_b \varepsilon_0} \qquad (1)$$

Here, $\varepsilon_0$ is the dielectric constant of vacuum, $\varepsilon_G$ is the relative permittivity of the GaN layer 12, $\varepsilon_b$ is the relative permittivity of the buffer layer 11, $d_G$ is the thickness of the GaN layer 12, and $d_b$ is the thickness of the buffer layer 11. As described above, the method for evaluating the electrical defect density of the semiconductor layer according to the present embodiment can also be applied to a semiconductor element including a plurality of semiconductor layers having different dielectric constants.

In the semiconductor element 1, $\varepsilon_G$ and $\varepsilon_b$ are 9.5 and 8.5 respectively, $d_G$ and $d_b$ are 1.3 μm and 3.5 μm, respectively, and the area of the electrode 13 corresponding to the area of the capacitor is 1 mm². As a result, $C_{cap}$ is calculated to be 16 pF.

Further, the charge $Q_{total}$ accumulated in the depletion layers formed in the buffer layer 11 and the GaN layer 12 is expressed by the following equation 2.

[Equation 2]

$$Q_{total} = Q_{cap} + Q_{dep} \qquad (2)$$

Here, $Q_{cap}$ is the accumulated charge when the semiconductor element 1 is an ideal capacitor in which all the regions of the buffer layer 11 and the GaN layer 12 (hereinafter referred to as epitaxial layer), and $Q_{dep}$ is the charge released from the epitaxial layer.

Among them, $Q_{cap}$ can be obtained by integrating the substrate current $I_{sub}$ with the time (0 to 0+) until the charge accumulates in the capacitor as shown in the following equation 3, since the time until the charge accumulates in the capacitor is on the order of nanoseconds, the substrate current $I_{sub}$ which is enough for calculating $Q_{cap}$ cannot be measured under the usual measurement environment (the time resolution of the measuring apparatus is on the order of microseconds).

[Equation 3]

$$Q_{cap} = \int_0^{0+} I_{sub} dt \qquad (3)$$

On the other hand, $Q_{cap}$ is expressed by the product of $C_{cap}$ and the applied voltage V as in the following equation 4. As described above, $C_{cap}$ can be obtained from Equation 1 and is 16 pF for the semiconductor element 1. Therefore, for example, $Q_{cap}$ is obtained as $1.12 \times 10^{-9}$ C when the applied voltage V is 70V.

[Equation 4]

$$Q_{cap} = C_{cap} V \qquad (4)$$

$Q_{dep}$ can be obtained by integrating the substrate current $I_{sub}$ with the time (0+ to ∞) after charge accumulation in the capacitor (steady state) as expressed by the following equation 5.

[Equation 5]

$$Q_{dep} = \int_{0+}^{\infty} I_{sub} dt \qquad (5)$$

Figure 3A:
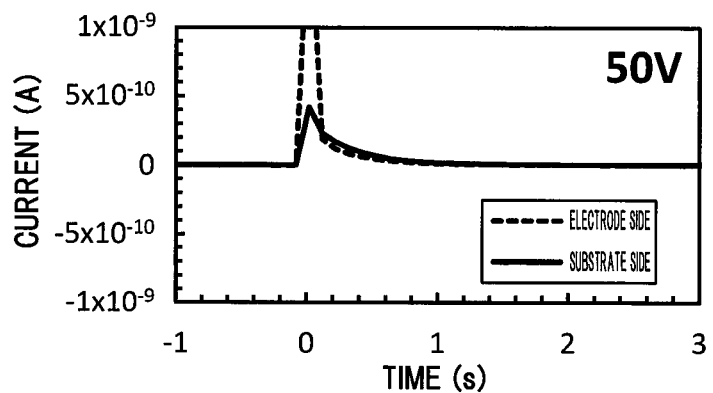
FIG. 3A is a graph showing temporal changes in substrate current and electrode current when the applied voltage is 50V.
Figure 3B:
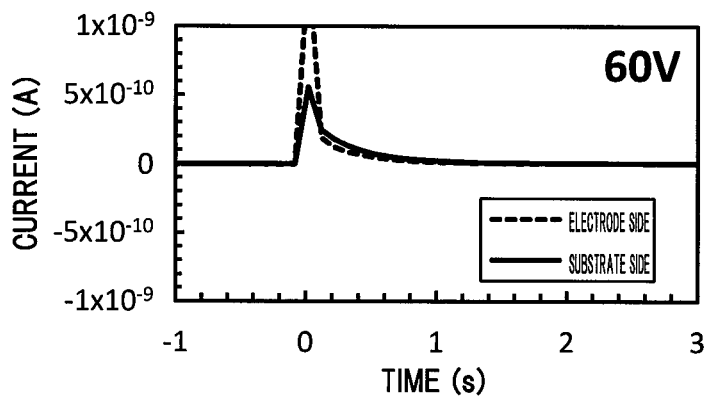
FIG. 3B is a graph showing temporal changes in substrate current and electrode current when the applied voltage is 60V.
Figure 3C:
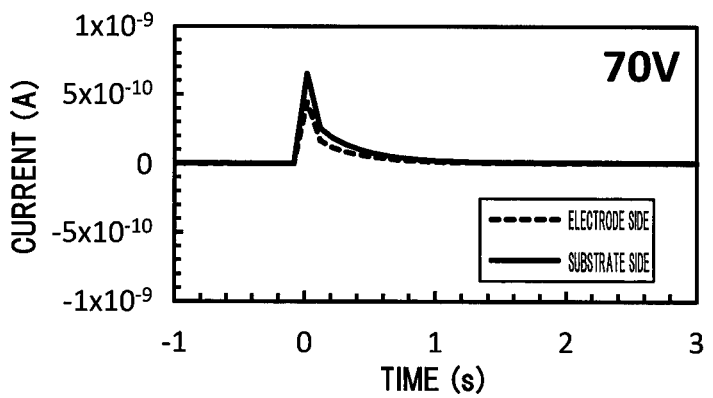
FIG. 3C is a graph showing temporal changes in substrate current and electrode current when the applied voltage is 70V.
Figure 3D:
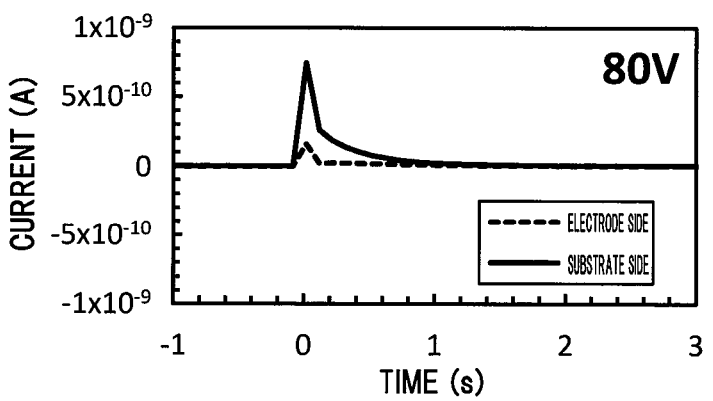
FIG. 3D is a graph showing temporal changes in the substrate current and the electrode current when the applied voltage is 80V.
Figure 4A:
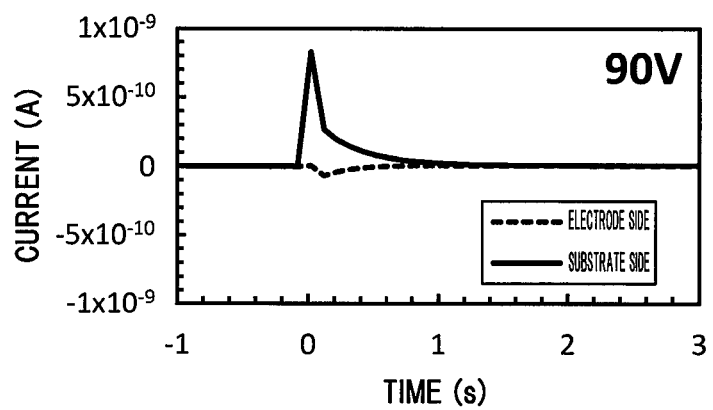
FIG. 4A is a graph showing temporal changes in substrate current and electrode current when the applied voltage is 90V.
Figure 4B:
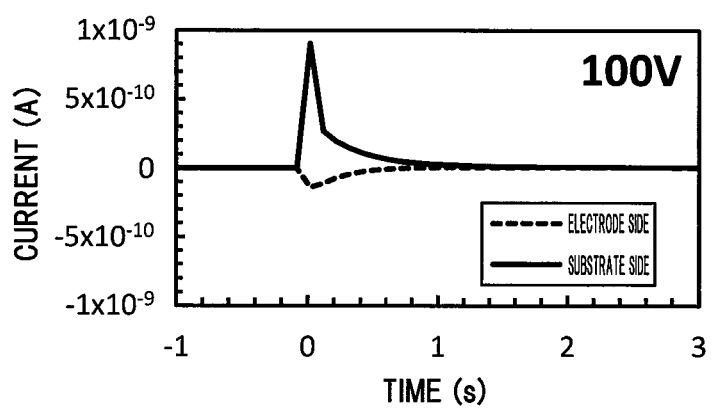
FIG. 4B is a graph showing temporal changes in substrate current and electrode current when the applied voltage is 100V.
Figure 4C:
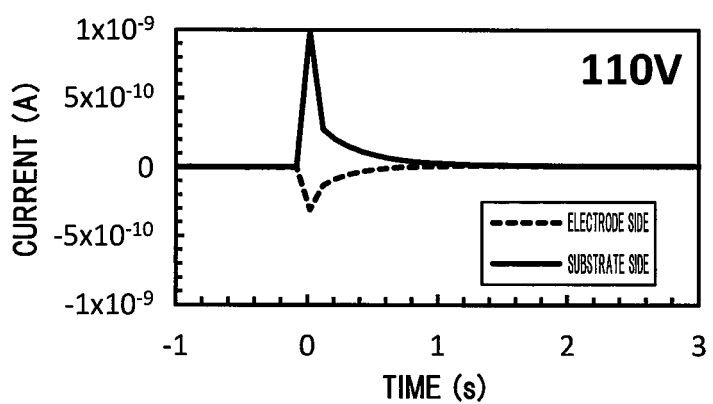
FIG. 4C is a graph showing temporal changes in substrate current and electrode current when the applied voltage is 110V.
Figure 4D:
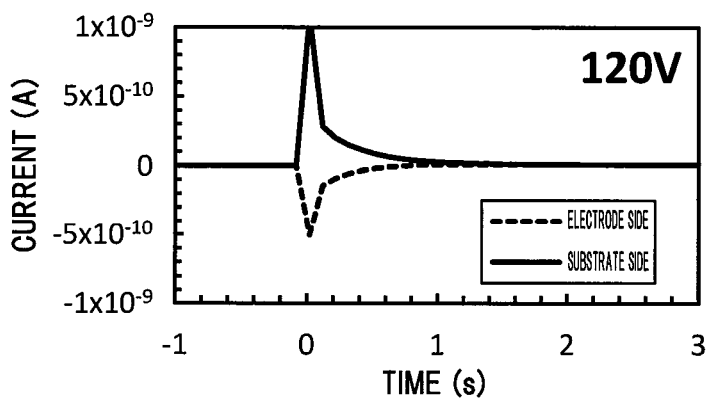
FIG. 4D is a graph showing temporal changes in substrate current and electrode current when the applied voltage is 120V.
Figure 5A:
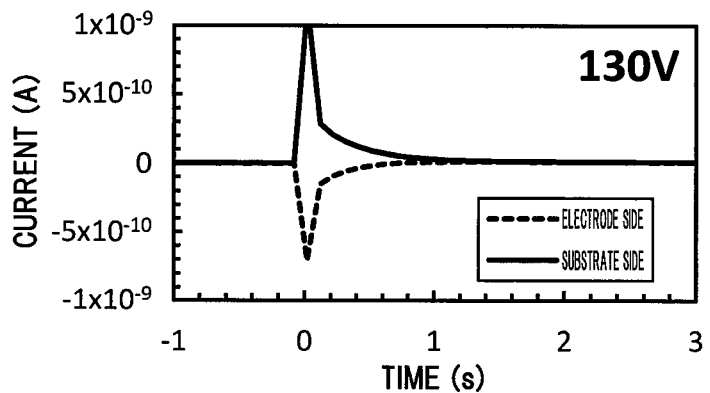
FIG. 5A is a graph showing temporal changes in substrate current and electrode current when the applied voltage is 130V.
Figure 5B:
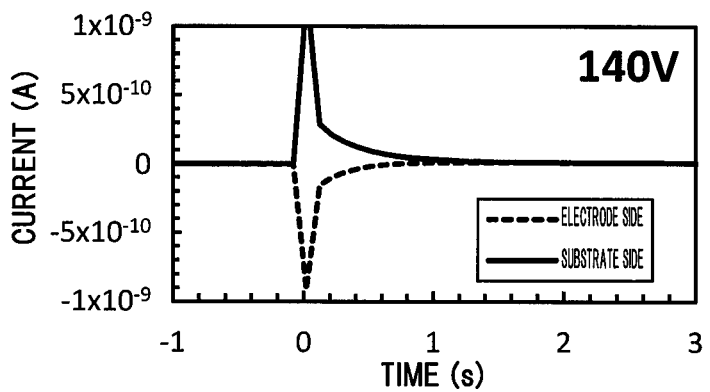
FIG. 5B is a graph showing temporal changes in substrate current and electrode current when the applied voltage is 140V.
Figure 5C:
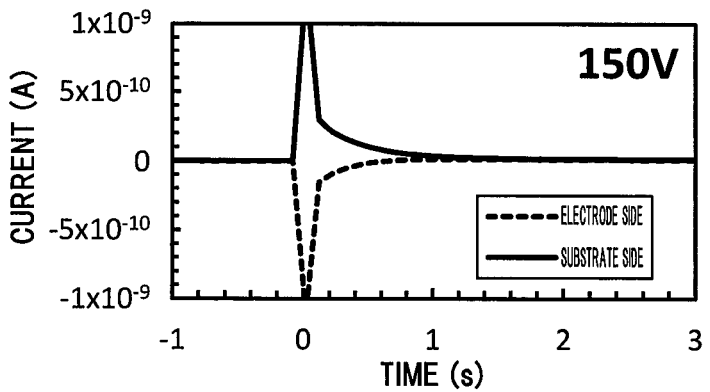
FIG. 5C is a graph showing temporal changes in substrate current and electrode current when the applied voltage is 150V.
Figure 5D:
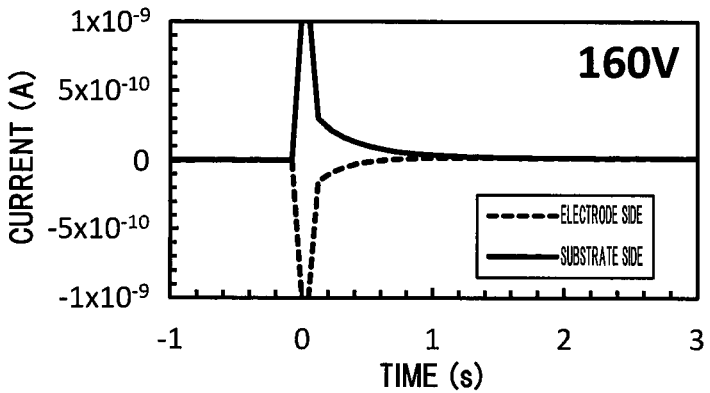
FIG. 5D is a graph showing temporal changes in substrate current and the electrode current when the applied voltage is 160V.
Figure 6A:
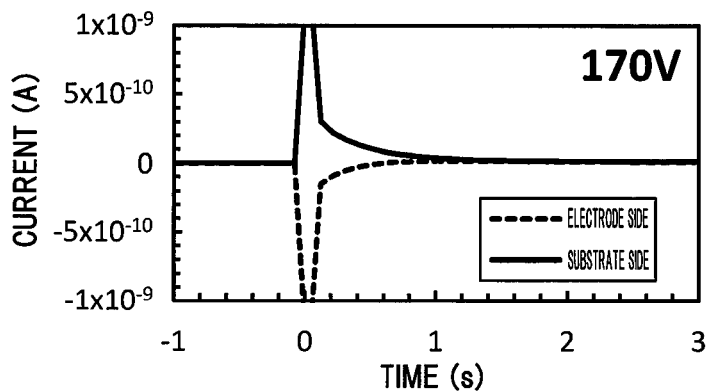
FIG. 6A is a graph showing temporal changes in substrate current and electrode current when the applied voltage is 170V.
Figure 6B:
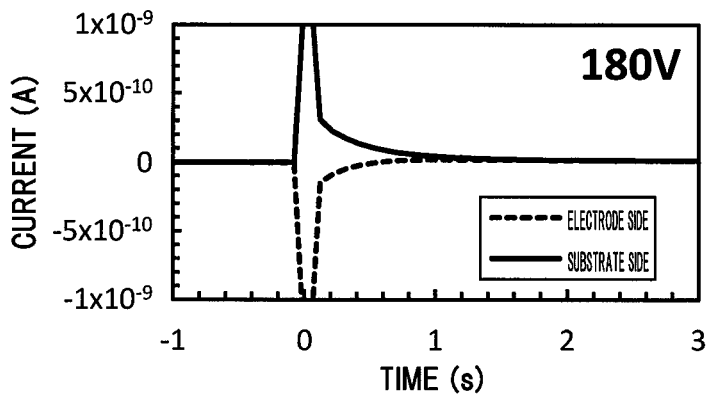
FIG. 6B is a graph showing temporal changes in substrate current and electrode current when the applied voltage is 180V.
Figure 6C:
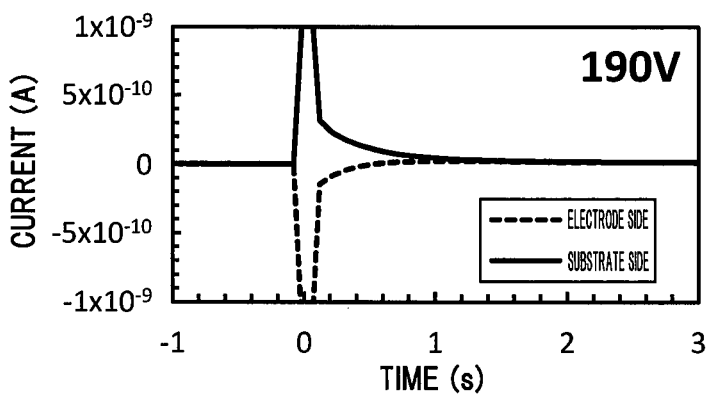
FIG. 6C is a graph showing temporal changes in substrate current and electrode current when the applied voltage is 190V.
Figure 6D:
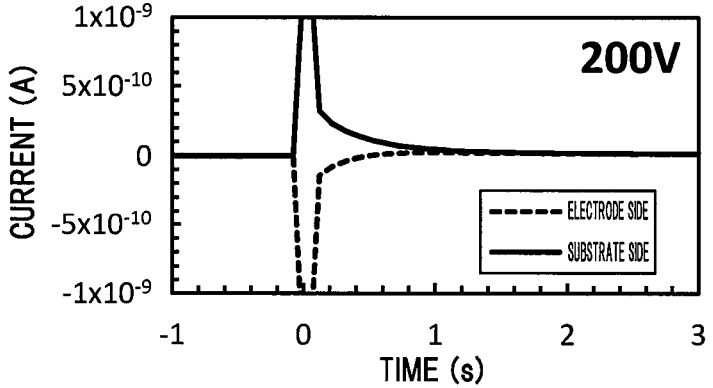
FIG. 6D is a graph showing temporal changes in substrate current and electrode current when the applied voltage is 200V.

From Equation 5, for example, $Q_{dep}$ when the applied voltage V of the semiconductor element 1 is 70V can be obtained as $1.73 \times 10^{-10}$ C using the integrated value of the substrate current $I_{sub}$ up to 10 seconds. The substrate current $I_{sub}$ when the applied voltage V is 70V is shown in FIG. 3C.

From $Q_{cap}$ obtained from Equation 4 and $Q_{dep}$ obtained from Equation 5, $Q_{total}$ is obtained using Equation 2.

Figure 7:
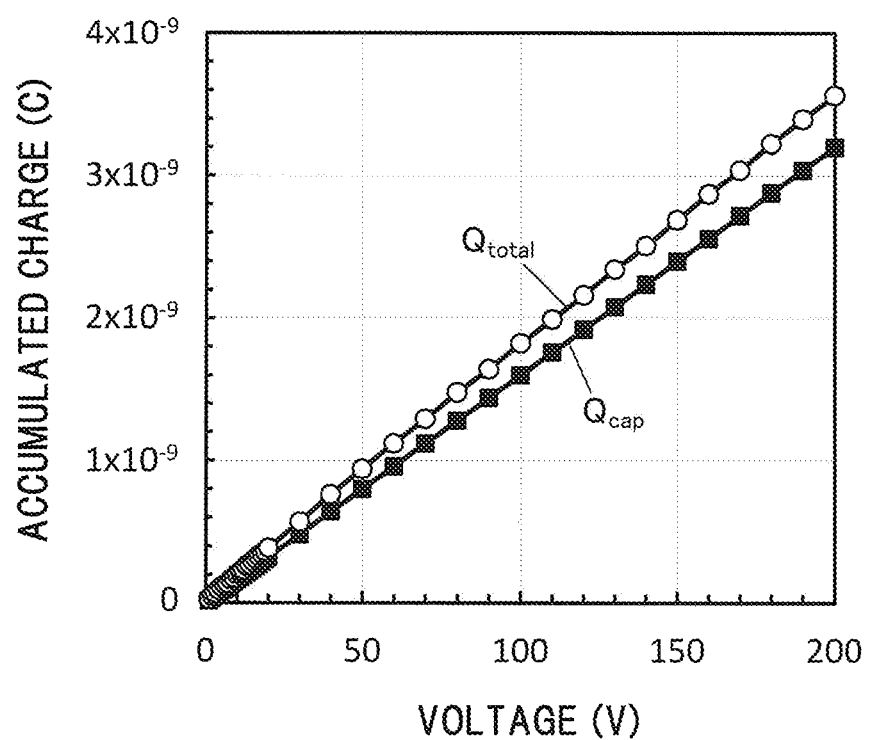
FIG. 7 is a graph plotting $Q_{cap}$ and $Q_{TOTAL}$ for each applied voltage.

FIG. 7 is a graph obtained by plotting $Q_{cap}$ obtained from Equation 4 and $Q_{total}$ obtained from Equations 2, 4, and 5 for each applied voltage. The difference $Q_{dep}$ between $Q_{total}$ and $Q_{cap}$ at each applied voltage is caused by an increase in capacitance due to depletion of the epitaxial layer.

The electric capacity $C_{dep}$ of the depletion layer in the steady state can be obtained using the following Equation 6.

[Equation 6]

$$Q_{total} = C_{dep} V \qquad (6)$$

Also, when the thickness z of the depletion layer is larger than the thickness $d_b$ of the buffer layer 11, $C_{dep}$ is expressed by the following Equation 7.

[Equation 7]

$$\frac{1}{C_{dep}} = \frac{z - d_b}{\varepsilon_G \varepsilon_0} + \frac{d_b}{\varepsilon_b \varepsilon_0} \qquad (7)$$

From Equation 7, the thickness z of the depletion layer is calculated. For example, it is calculated that z is 4.07 μm when the applied voltage V of the semiconductor element 1 is 70V. In this case, since the thickness of the buffer layer 11 is 3.5 μm, the entire region of the buffer layer 11 is depleted, and the region of 0.57 μm thickness on the buffer layer 11 side of the GaN layer 12 is depleted.

Figure 8:
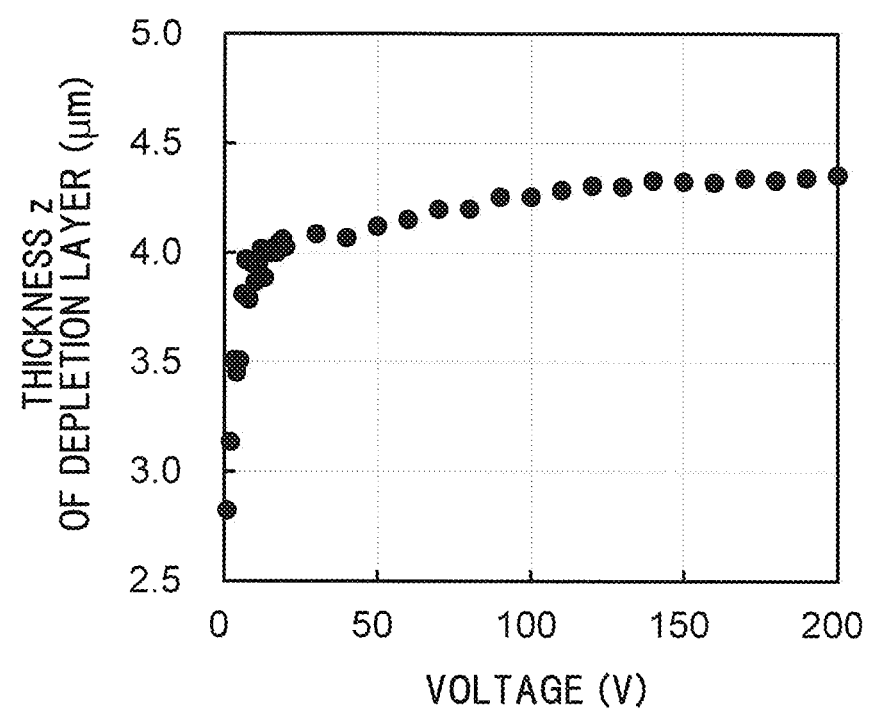
FIG. 8 is a graph showing the relationship between the thickness z of the depletion layer and the applied voltage V.

FIG. 8 is a graph showing the relationship between the applied voltage V and the thickness z of the depletion layer (at the position of the upper end of the depletion layer with reference to the interface between the substrate 10 and the buffer layer 11). When the applied voltage V is 5V, the entire region of the buffer layer 11 is depleted.

When the relative permittivity $\varepsilon_G$ of the GaN layer 12 and the relative permittivity $\varepsilon_b$ of the buffer layer 11 can be regarded as being equal ($\varepsilon_G \varepsilon_0 = \varepsilon_b \varepsilon_0 = \varepsilon$), the above equations can be simplified. In this case, from Equation 1 and Equation 4, $C_{cap}$ and $Q_{cap}$ are expressed as $\varepsilon/d$ and $\varepsilon V/d$, respectively. From Equations 2, 5, 6, and 7, $C_{dep}$ is expressed as $\varepsilon/z$. As a result, the following Equation 8 is established.

[Equation 9]

$$Q_{dep} = Q_{total} - Q_{cap} = \int_{0+}^{\infty} I_{sub} dt = \varepsilon \left( \frac{1}{z} - \frac{1}{d} \right) \qquad (8)$$

The following Equation 9 is a formula showing the relationship between the electrical defect density ρ in the epitaxial layer in the steady state and the applied voltage V. Here, x is a distance in the thickness direction with the interface between the substrate 10 and the buffer layer 11 as the origin, and ρ is a function of x.

[Equation 9]

$$V = \frac{q}{\varepsilon(z)} \int_0^z \rho(x) \cdot x \, dx \quad (9)$$

In Equation 9 and Equations 10 and 11 to be described later, ε is the relative permittivity of the epitaxial layer composed of the buffer layer 11 and the GaN layer 12, and is expressed as a function of the thickness z of the depletion layer. Equation 7 can be expressed using this ε as the following Equation 10.

[Equation 10]

$$\frac{1}{C_{dep}} = \frac{z}{\varepsilon(z)} \quad (10)$$

The following Equation 11 is derived from the first-order differentiation of Equation 9 with z.

[Equation 11]

$$\frac{dV}{dz} = \frac{q}{\varepsilon(z)} \rho(z) \cdot z \quad (11)$$

Then, the following Equation 12 is obtained by modifying Equation 10.

[Equation 12]

$$\rho(z) = \frac{\varepsilon(z)}{qz} \cdot \frac{dV}{dz} \quad (12)$$

From Equation 12, it is possible to derive the electrical defect density ρ in the epitaxial layer at the position z (the distance from the interface between the substrate 10 and the buffer layer 11) with reference to the interface between the substrate 10 and the buffer layer 11.

Figure 9:
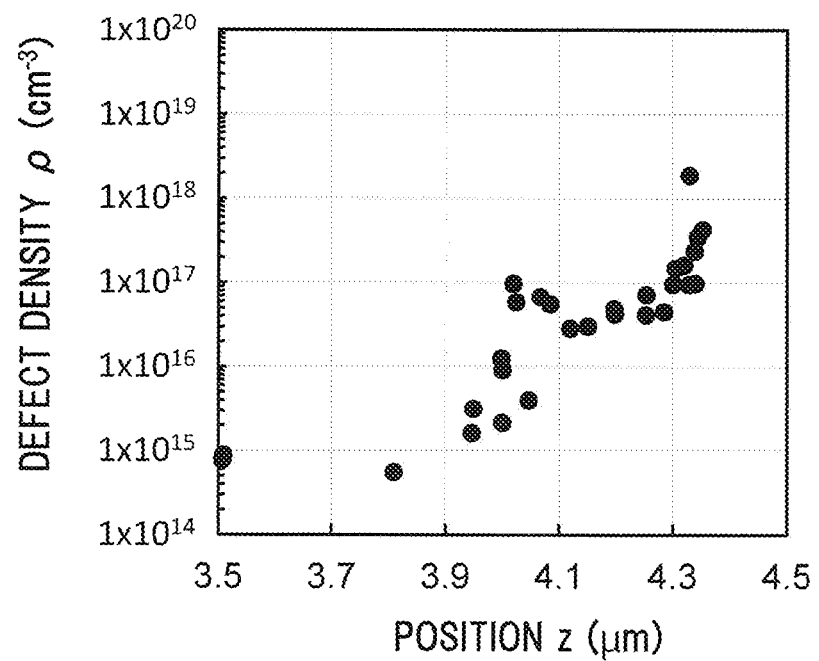
FIG. 9 is a graph showing the relationship between the electrical defect density ρ in the epitaxial layer in the steady state and the position z.

FIG. 9 is a graph showing the relationship between the electrical defect density ρ in the GaN layer 12 in the steady state obtained from Equation 12 and the position z.

For example, in the case where the GaN layer 12 is used as a layer serving as a current path of a high electron mobility transistor (HEMT), the maximum value of the electrical defect density of the GaN layer 12, which is obtained by using the charge amount immediately after the current application and the charge amount in the steady state as described above, is preferably $1.0 \times 10^{19}$ cm$^{-3}$ or less, more preferably $2.0 \times 10^{18}$ cm$^{-3}$ or less. In the HEMT, an AlGaN layer is formed on the GaN layer 12, and a region having a depth of several nm from the interface with the AlGaN layer of the GaN layer 12 serves as a current path.

(Second Method)

The second method is a method of obtaining the density of the electrical defect of the semiconductor layer from the difference between the substrate current measured by the ammeter 15a and the electrode current measured by the ammeter 15b.

The net charge amount $Q_{net}$ accumulated in the epitaxial layer of the semiconductor element 1 as a capacitor can be obtained by integrating the difference between the substrate current $I_{sub}$ and the electrode current $I_{ele}$ with time.

[Equation 13]

$$Q_{net} = \int_0^\infty (I_{sub} - I_{ele}) dt \quad (13)$$

Figure 10:
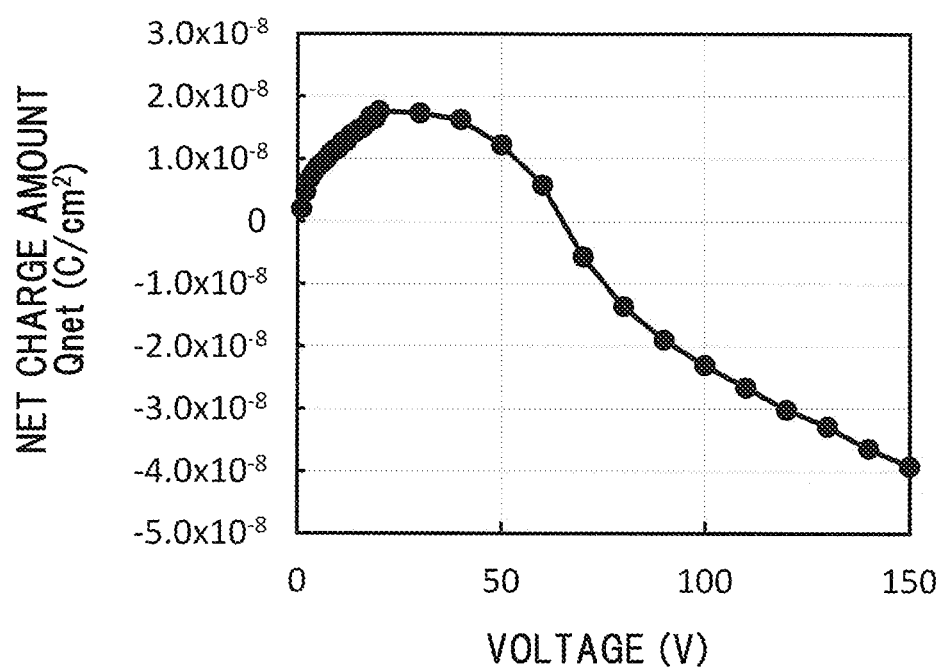
FIG. 10 is a graph showing the relationship between the net charge amount $Q_{net}$ accumulated in the epitaxial layer and the applied voltage V.

FIG. 10 is a graph showing the relationship between the net charge amount $Q_{net}$ accumulated in the epitaxial layer which is obtained by Equation 13 and the applied voltage V. The region where the net charge amount $Q_{net}$ decreases with the increase of the applied voltage V in FIG. 10 is the region where the electrode current flows backward.

It can be assumed that the net charge amount $Q_{net}$ is equal to the planar density (surface density) of the defects in the region where the net charge amount $Q_{net}$ decreases with the increase of the applied voltage V in FIG. 10 (the region where the applied voltage V is 20V or less). Using the thickness z of the depletion layer at each voltage of the applied voltage V obtained by the first method, the relationship between the net charge amount $Q_{net}$ and the applied voltage V in FIG. 10 can be converted into the relationship between the planar density of the defects and the position z.

Figure 11:
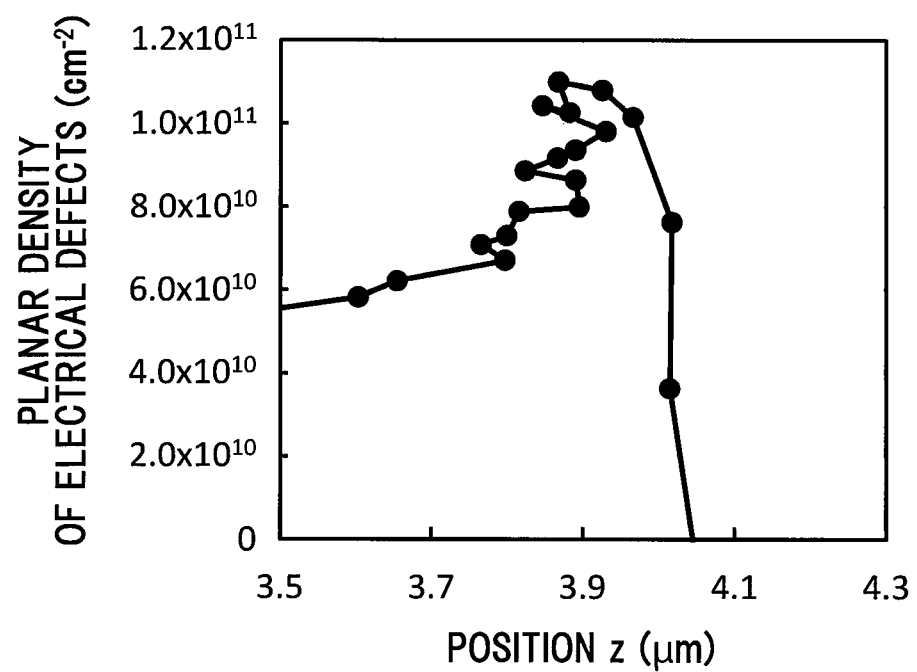
FIG. 11 is a graph showing the relationship between the planar density of electrical defects in the GaN layer and the position z.

FIG. 11 is a graph showing the relationship between the planar density of electrical defects in the GaN layer 12 and the position z.

In the example, the semiconductor element 1 having the structure shown in FIG. 1 was used as a sample of the electrical defect density evaluation method. The semiconductor element 1 has a substrate 10 made of Si having a (111) plane as a main surface, a GaN layer 12 formed on the substrate 10 via a buffer layer 11, an electrode 13 having a Ti/Al/Ni/Au laminated structure. The GaN layer 12 has a C—GaN layer 12a made of a GaN film doped with C (carbon) and an undoped GaN layer 12b composed of a GaN film not doped with impurities on the C—GaN layer 12a. The thicknesses of the buffer layer 11, the C—GaN layer 12a, and the undoped GaN layer 12b were 3.5 μm, 730 nm, and 570 nm, respectively. In addition, the electrode 13 was a circular electrode having a radius of 560 μm and an area of 1 mm².

The value of the intercept of FIG. 11, that is, the value of the planar density of the defects at the interface (z=3.5 μm) between the buffer layer 11 and the GaN layer 12 is $5.6 \times 10^{10}$ cm$^{-2}$. Assuming that the defects are uniformly distributed in the buffer layer 11 having a thickness of 3.5 μm, the electrical defect density in the buffer layer 11 is calculated as $5.6 \times 10^{10}$ cm$^{-2}$/3.5 μm=$1.4 \times 10^{16}$ cm$^{-3}$. This electrical defect density is substantially equal to the electrical defect density obtained by the first method.

The electrical defect density in the GaN layer 12 is obtained from the slope of the line in FIG. 11. That is, by dividing the minute change amount of the planar density in a certain region in the GaN layer 12 by the minute change amount of the distance, the electrical defect density in that region can be obtained.

According to FIG. 11, in a region where the planar density of electrical defects increases (a region where the position z is about 3.5 to 3.9 μm) as a distance from the interface with the buffer layer 11 which is the low potential side surface at the time of current application, the planar density of electrical defects increases with two gradients.

The electrical defect density in the two regions where the slopes of increase of the planar density of this defects differ from each other is calculated as $3.7 \times 10^{14}$ cm$^{-3}$ (in the region where the position z is approximately 3.5 to 3.8 μm) and $2.0 \times 10^{15}$ cm$^{-3}$ (in the region where the position z is approximately 3.8 to 3.9 μm). It is considered that $3.7 \times 10^{14}$ cm$^{-3}$ is equivalent to the electrical defect density obtained by the first method and indicates the electrical defect density in the region close to the buffer layer 11. Further, $2.0 \times 10^{15}$ cm$^{-3}$ is considered to indicate the electrical defect density of the interface between the C—GaN layer 12a and the undoped GaN layer 12b or the undoped GaN layer 12b.

(Effect of Embodiment)

According to the method for evaluating the electrical defect density of a semiconductor in the above embodiment, the density of the charge trapped in the deep defect level can be examined. Therefore, the method for evaluating the electrical defect density of a semiconductor in the above embodiment is particularly useful as a method for evaluating the electrical defect density of a wide bandgap semiconductor having a deep defect level, for example, a semiconductor layer having a bandgap of 2.5 eV or more.

A highly reliable semiconductor device can be manufactured by using a semiconductor template including a semiconductor layer evaluated by the method for evaluating electrical defect density of a semiconductor in the above embodiment. In particular, it is useful for manufacturing a power device such as a power transistor using a wide bandgap semiconductor.

As described above, the structure of the semiconductor element to be evaluated in the method for evaluating electrical defect density of a semiconductor layer according to the present invention is not limited to the structure of the semiconductor element 1. For example, the substrate is not particularly limited as long as it is an electrically conductive substrate, and even when an insulating substrate is used, a semiconductor layer to be evaluated may be formed on the insulating substrate via an electrically conductive layer. In this case, instead of the substrate current, the current of the conductive layer on the insulating substrate is measured. The layer structure and composition of the semiconductor layer are also not particularly limited. In addition, the electrode is not particularly limited as long as it is an ohmic electrode.

Although the embodiments of the present invention have been described above, the present invention is not limited to the above-described embodiments, and various modifications can be made without departing from the gist of the invention.

In addition, the embodiment described above does not limit the invention according to the claims. It should also be noted that not all combinations of features described in the embodiments are indispensable to means for solving the problem of the invention.

INDUSTRIAL APPLICABILITY

A method for evaluating the electrical defect density of a semiconductor layer applicable to a wide bandgap semiconductor having a deep defect level and a semiconductor element with a low electrical defect density which can be evaluated by the method are provided.

REFERENCE SIGNS LIST

1 Semiconductor element
10 Substrate
11 Buffer layer
12 GaN layer
12a C—GaN layer
12b Undoped GaN layer
13 Electrode

The invention claimed is:

1. A method for evaluating an electrical defect density of a semiconductor layer, comprising:
applying a voltage to a semiconductor layer comprising a substrate and a buffer layer and measuring a first electric current value at the substrate or both the first electric current and a second electric current value at an electrode contact with a surface of the semiconductor layer opposite to the substrate; and
deriving the electrical defect density at a position with respect to an interface between the substrate and the buffer layer in the semiconductor layer with use of the first electric current value or a difference between the first electric current value and the second electric current value.

2. A semiconductor element, comprising:
a semiconductor layer serving as a current path, wherein a maximum value of an electrical defect density obtained by using a charge amount immediately after current application and a charge amount in steady state of the semiconductor layer is $1.0 \times 10^{19}$ cm$^{-3}$ or less, wherein a planar density of electrical defects in the semiconductor layer obtained by using a net charge amount accumulated in the semiconductor layer by the current application increases with two gradients, in a region where the planar density of the electrical defects increases as a distance from a low potential side surface at the time of the current application to the semiconductor layer,
wherein the two gradients are a first gradient of a planar density of electrical defects of the low potential side in the semiconductor layer and a second gradient of a planar density of electrical defects of a high potential side in the semiconductor layer,
wherein the second gradient is larger than the first gradient.

3. The semiconductor element according to claim 2, wherein a bandgap of the semiconductor layer is 2.5 eV or more.

* * * * *